(12) United States Patent
Yamamoto

(10) Patent No.: US 6,266,891 B1
(45) Date of Patent: Jul. 31, 2001

(54) METHOD OF AND APPARATUS FOR BONDING COMPONENT

(75) Inventor: Kiyohumi Yamamoto, Minamiashigara (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/404,193

(22) Filed: Sep. 23, 1999

(30) Foreign Application Priority Data

Sep. 25, 1998 (JP) .................................................. 10-271318
Feb. 26, 1999 (JP) .................................................. 11-050901

(51) Int. Cl.[7] .................................................. G01C 11/25
(52) U.S. Cl. .................................................. 33/645; 33/286
(58) Field of Search .............................. 33/613, 645, 286, 33/DIG. 21

(56) References Cited

U.S. PATENT DOCUMENTS

| | | | |
|---|---|---|---|
| 4,376,338 | * | 3/1983 | Wickham ................................ 33/645 |
| 4,383,373 | * | 5/1983 | Couturier ................................ 33/286 |
| 4,721,365 | * | 1/1988 | Nishimura ................................ 33/613 |
| 5,077,905 | * | 1/1992 | Murray, Jr. ...................... 33/DIG. 21 |
| 5,456,018 | * | 10/1995 | Irlbeck et al. ........................... 33/645 |
| 6,040,903 | * | 3/2000 | Lysen et al. ............................. 33/645 |

FOREIGN PATENT DOCUMENTS 6-334022   12/1994   (JP) .

* cited by examiner

Primary Examiner—G. Bradley Bennett
(74) Attorney, Agent, or Firm—Sughrue, Mion, Zinn, Macpeak & Seas, PLLC

(57) ABSTRACT

A bonding apparatus for bonding a component on a board at a predetermined position thereon has a displacement mechanism for displacing a board holding unit for holding a board and a component holding unit for holding a component relatively to each other to reach a bonding position, a laser distance measuring mechanism for measuring a distance of said board holding unit or said component holding unit from said bonding position directly with a laser beam, and an imaging mechanism for detecting a position of said component with cameras and positionally correcting the component if necessary. The bonding apparatus allows components, i.e., LED chips, to be positioned highly accurately without being affected by spaced intervals between the components.

9 Claims, 9 Drawing Sheets

METHOD OF AND APPARATUS FOR BONDING COMPONENT

BACKGROUND OF THE INVENTION

1. Field of the Invention

The present invention relates to a method of and an apparatus for bonding a component in a predetermined position on a board.

2. Description of the Related Art

Generally, a linear array of light-emitting elements such as laser diodes, light-emitting diodes, or the like is used as a light source for image reading and outputting (recording) applications. For example, as shown in FIG. 10 of the accompanying drawings, an LED array 1 comprises a plurality of LED chips (components) 3 mounted on a board 2 at equally spaced intervals and arranged in a linear pattern extending in one direction. The LED chips 3 are bonded on the board 2 by silver paste, with gold wires 4 extending from the respective LED chips 3.

Heretofore, the technique disclosed in Japanese laid-open patent publication No. 6-334022, for example, is known for bonding a plurality of LED chips on a board. According to the disclosed bonding process, an alignment mark on the board and alignment marks on the LED chips are read by individual cameras, and a biaxially movable stage, which supports the board and are movable along X- and Y-axes, is operated on the basis of positional information representing the read alignment marks, after which the LED chips are bonded on the board.

In the disclosed bonding arrangement, the bonding accuracy of the LED chips depends largely on the accuracy with which the biaxially movable stage is positionally measured. The position of the biaxially movable stage is usually measured by encoders or linear scales mounted on slide guides. However, since pitching and yawing displacements of the upper surface of the biaxially movable stage, which serves as a workpiece support, cannot be fully measured, the bonding accuracy of the LED chips tends to be lowered.

According to another bonding process, which is based on the above disclosed bonding process, the LED chips are simultaneously imaged by the camera, and then positionally corrected in order to equalize the distances between the alignment marks on the LED chips before the LED chips are bonded on the board.

However, the other bonding process is disadvantageous in that if the LED chips are widely spaced apart, then they cannot be simultaneously recognized. Another problem is that since the LED chips themselves are tiny pieces, it is difficult to apply alignment marks to the LED chips. In addition, the bonding process is not versatile as it can be applied to transparent boards only.

SUMMARY OF THE INVENTION

It is therefore an object of the present invention to provide a method of and an apparatus for bonding components by positioning the components highly accurately without being affected by spaced intervals between the components.

The above and other objects, features, and advantages of the present invention will become more apparent from the following description when taken in conjunction with the accompanying drawings in which a preferred embodiment of the present invention is shown by way of illustrative example.

DESCRIPTION OF THE PREFERRED EMBODIMENT

Figure 1:
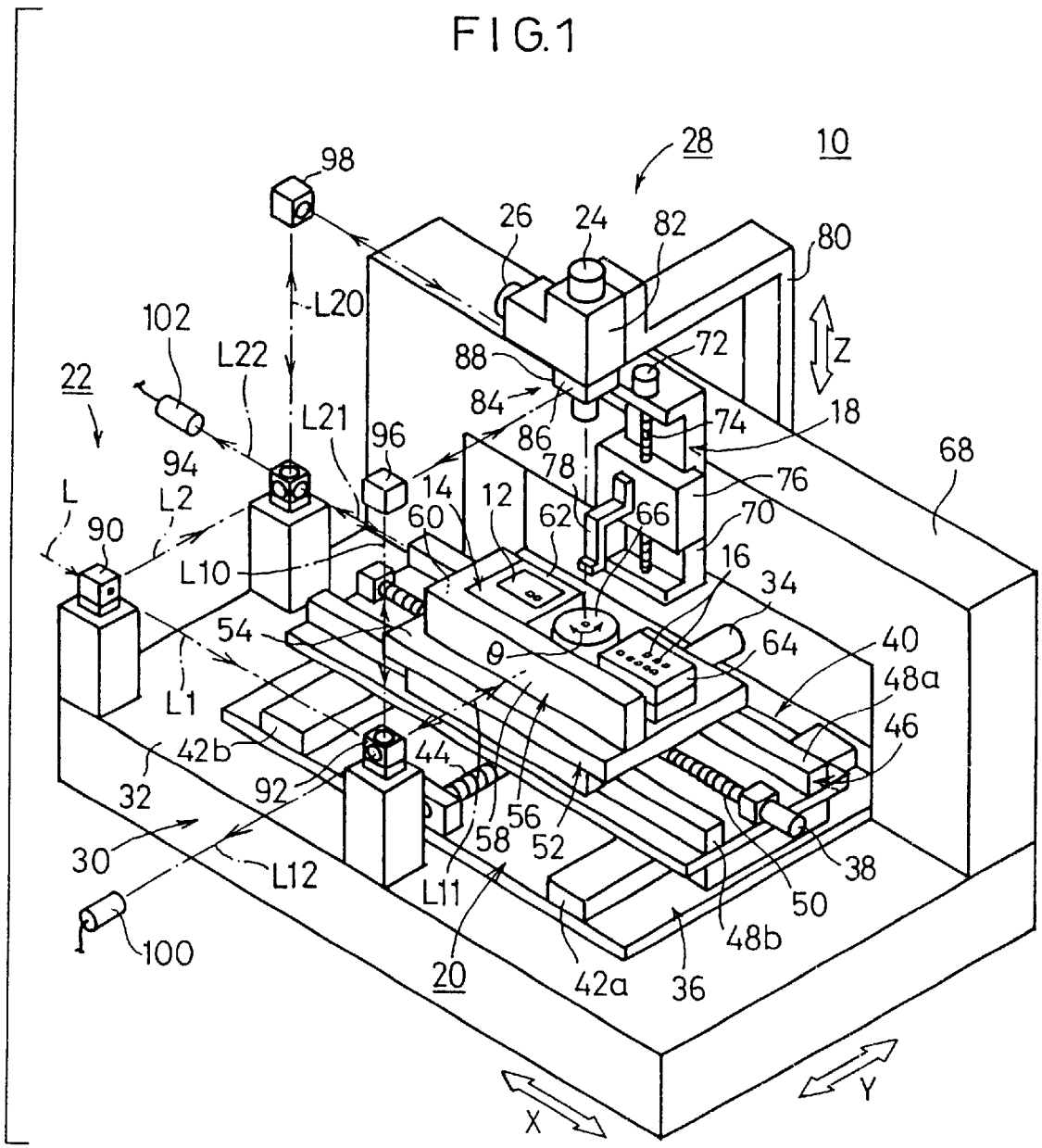
FIG. 1 is a perspective view of a bonding apparatus according to the present invention.
Figure 2:
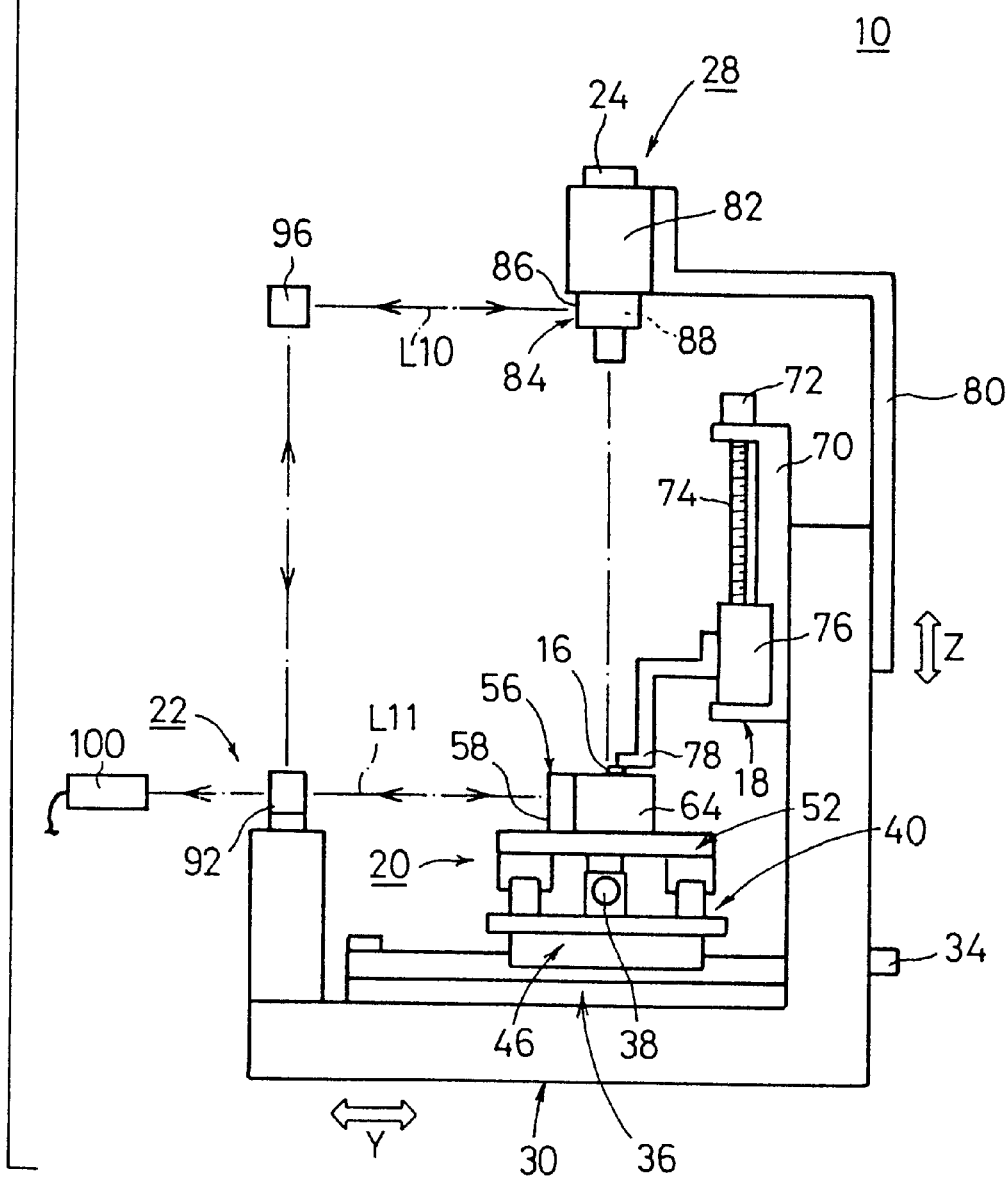
FIG. 2 is a side elevational view of the bonding apparatus shown in FIG. 1.

FIG. 1 shows in perspective a bonding apparatus 10 for carrying out a bonding method according to the present invention. FIG. 2 shows the bonding apparatus 10 in side elevation.

The bonding apparatus 10 generally comprises a displacement mechanism 20 for displacing a board holding unit (board holding means) 14 which holds a board 12 relatively to a component holding unit (component holding means) 18 which holds an LED chip 16 in order to reach a bonding position, a laser distance measuring mechanism 22 for directly measuring a distance of the board holding unit 14 from the bonding position with laser beams, and an imaging mechanism 28 for measuring the position of the LED chip 16 with CCD (Charge-Coupled Device) cameras 24, 26 and positionally correcting, if necessary, the LED chip 16.

The displacement mechanism 20 is mounted on an upper surface 32 of a mount base 30 of the bonding apparatus 10. The displacement mechanism 20 has a first movable stage 36 movable along a Y-axis of an orthogonal coordinate system by a first motor (actuator) 34 and a second movable stage 40 movable along an X-axis of the orthogonal coordinate system with respect to the first movable stage 36 by a second motor (actuator) 38.

The first movable stage 36 comprises a pair of guide rails 42a, 42b extending along the Y-axis and a ball screw 44 disposed between guide rails 42a, 42b and extending along the Y-axis. The first motor 34 has an output shaft coupled to an end of the ball screw 44. The ball screw 44 is threaded through a nut (not shown) fixed to a lower surface of a Y-axis movable table 46 that is movably supported on the guide rails 42a, 42b.

The Y-axis movable table 46 is of an elongate shape along the X-axis. The Y-axis movable table 46 supports thereon a pair of guide rails 48a, 48b extending along the X-axis and a ball screw 50 disposed between guide rails 48a, 48b and extending along the X-axis. The guide rails 48a, 48b and the ball screw 50 belong to the second movable stage 40. The second motor 38 has an output shaft coupled to an end of the ball screw 50. The ball screw 50 is threaded through a nut (not shown) fixed to a lower surface of an X-axis movable table 52 that is movably supported on the guide rails 48a, 48b.

The X-axis movable table 52 supports on an upper surface 54 thereof a mirror block 56 for reflecting a laser beam L emitted from the laser distance measuring mechanism 22. The mirror block 56 is made of a material of small coefficient of thermal expansion, e.g., a glass material. The mirror block 56 has a first reflecting surface 58 extending along the X-axis and a second reflecting surface 60 extending along the Y-axis.

The board holding unit 14 has a board suction base 62 integrally with or separately from the mirror block 56. The board suction base 62 has a plurality of suction holes (not shown) defined in an upper surface thereof and held in communication with a vacuum source (not shown). On the upper surface 54 of the X-axis movable table 52, there are mounted a component laying base (component laying means) 64 for laying a plurality of LED chips 16 thereon, and a turntable 66 for positionally correcting the LED chips 16. The turntable 66 is rotatable about a vertical axis (Z-axis) by an actuator (not shown).

The component holding unit 18 has a support member 70, which is substantially C-shaped as viewed in side elevation, fixedly mounted on a wall 68 extending upwardly from an end of the mount base 30. A third motor 72 is fixed to an upper end of the support member 70 and has an output shaft coupled to a vertical ball screw 74 extending along the Z-axis and threaded through a vertically movable base 76. A suction member 78 connected to a vacuum source (not shown) is secured to the vertically movable base 76.

The imaging mechanism 28 has an arm 80 mounted on the wall 68 and supporting the CCD cameras 24, 26 on its distal end, the CCD cameras 24, 26 being directed along the Z- and X-axes, respectively. A two-focus optical system 82 is positioned on the optical axes of the CCD cameras 24, 26, and a mirror block 84 is fixed to the two-focus optical system 82. The mirror block 84 has a first reflecting surface 86 extending along the X-axis and a second reflecting surface 88 extending along the Y-axis.

The laser distance measuring mechanism 22 comprises a beam splitter 90 to which a laser beam L generated by a laser beam source (not shown) is applied, a first displaced position detecting means (e.g., a laser interferometer) 92 for dividing a laser beam Li emitted from the beam splitter 90 along the X-axis into a reference beam L10 and a distance measurement beam L11, applying the reference beam L10, which is directed upwardly, via a mirror 96 to the first reflecting surface 86, which provides a reference position on the Y-axis, of the mirror block 84 associated with the CCD cameras 24, 26, and applying the distance measurement beam L11, which is directed horizontally, to the first reflecting surface 58 of the mirror block 56 thereby to detect a position of the board holding unit 14 displaced along the Y-axis with respect to the CCD cameras 24, 26, and a second displaced position detecting means (e.g. a laser interferometer) 94 for dividing a laser beam L2 emitted from the beam splitter 90 along the Y-axis into a reference beam L20 and a distance measurement beam L21, applying the reference beam L20, which is directed upwardly, via a mirror 98 to the second reflecting surface 88, which provides a reference position on the X-axis, of the mirror block 84 associated with the CCD cameras 24, 26, and applying the distance measurement beam L21, which is directed horizontally, to the second reflecting surface 60 of the mirror block 56 thereby to detect a position of the board holding unit 14 displaced along the X-axis with respect to the CCD cameras 24, 26.

The first displaced position detecting means 92 causes the distance measurement beam L11 reflected by the first reflecting surface 58 of the mirror block 56 to interfere with the reference beam L10 reflected by the first reflecting surface 86 of the mirror block 84, producing an interference beam L12 which is applied to a first receiver 100. The second displaced position detecting means 94 causes the distance measurement beam L21 reflected by the second reflecting surface 60 of the mirror block 56 to interfere with the reference beam L20 reflected by the second reflecting surface 88 of the mirror block 84, producing an interference beam L22 which is applied to a second receiver 102.

Figure 3:
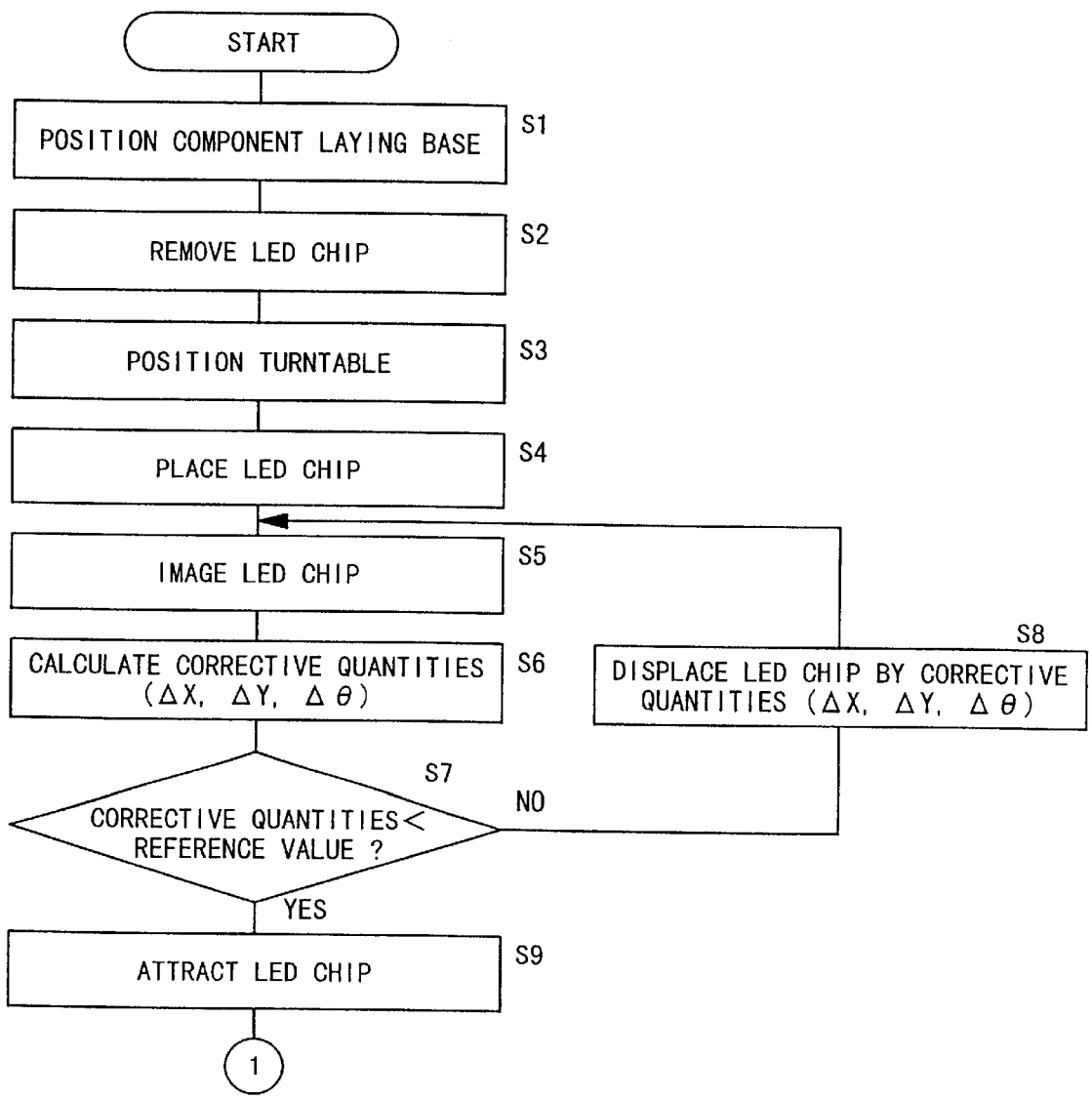
FIG. 3 is a flowchart of a former part of a bonding method according to the present invention.
Figure 4:
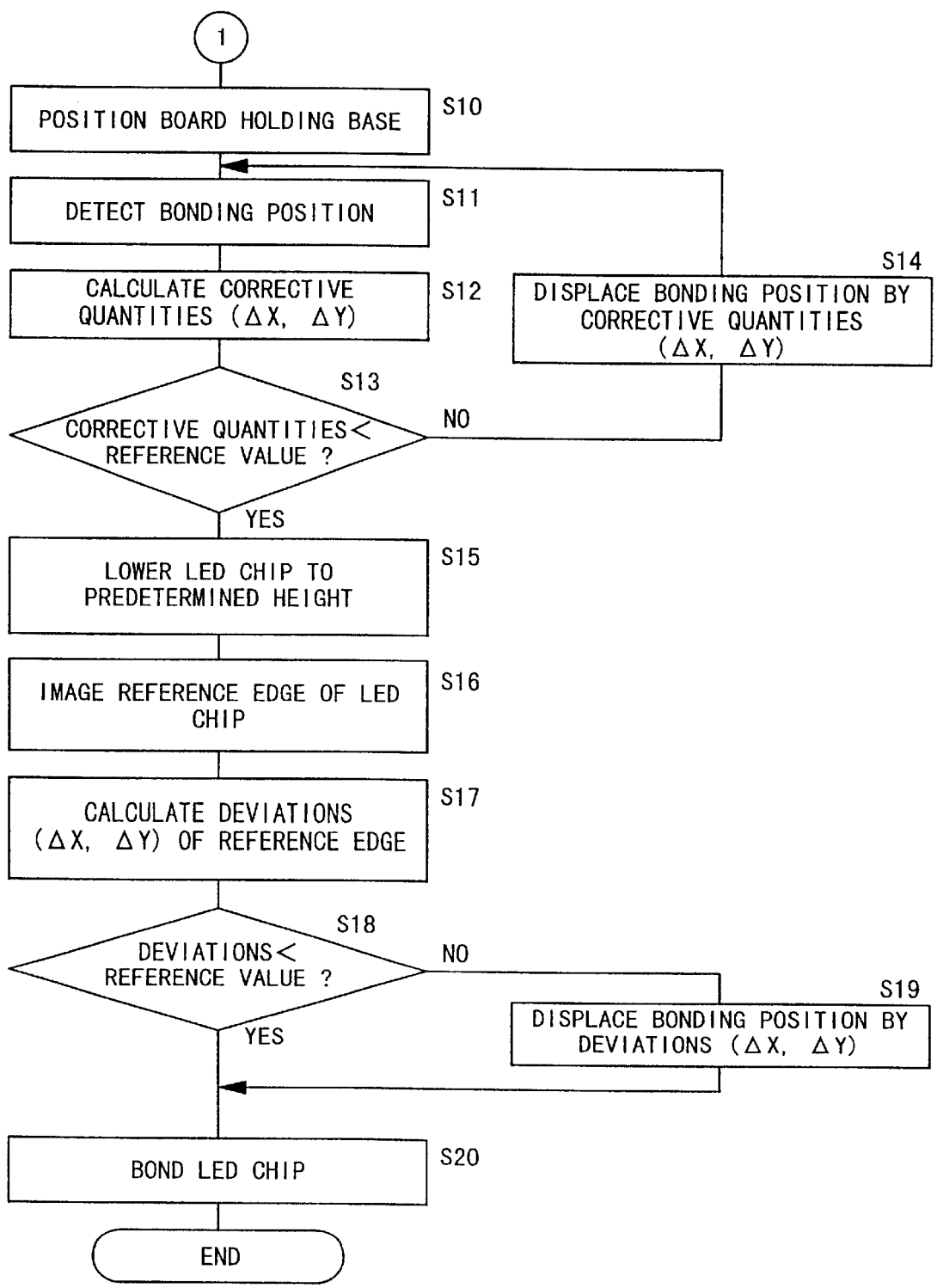
FIG. 4 is a flowchart of a latter part of the bonding method according to the present invention.

Operation of the bonding apparatus 10 thus constructed will be described below with reference to FIGS. 3 and 4.

The board 12 is set on the board suction base 62 of the board holding unit 14. The board 12 has been positioned with its edge along the X-axis being held in alignment with reference surface (not shown), and attracted to the board suction base 62 under a vacuum developed via the suction holes in the board suction base 62. A plurality of LED chips 16 are placed on the component laying base 64.

The displacement mechanism 20 is actuated to position the component laying base 64 into alignment with the component holding unit 18, i.e., a component removal position in step S1. In the displacement mechanism 20, the first motor 34 is energized to rotate the ball screw 44 about its own axis to move the Y-axis movable table 46 along the Y-axis, and the second motor 38 is energized to rotate the ball screw 50 about its own axis to move the X-axis movable table 52 along the X-axis. Therefore, when the first and second motors 34, 38 are energized, the LED chips 16 on the component laying base 64 are brought into the component removal position where an LED chip 16 can be removed by the component holding unit 18.

Figure 5:
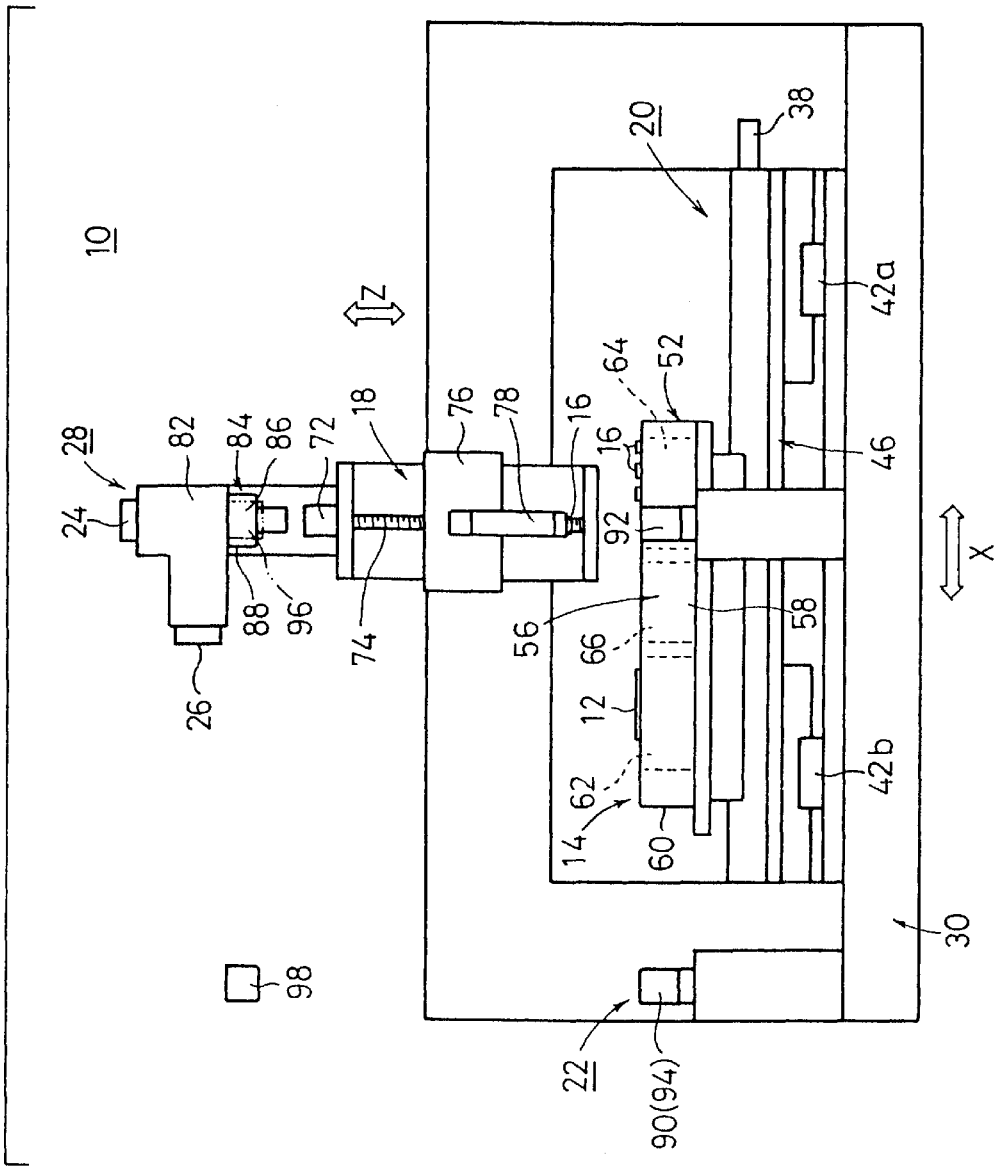
FIG. 5 is a front elevational view of the bonding apparatus shown in FIG. 1 with an LED chip on a component support being held by a suction member.

The third motor 72 of the component holding unit 18 is energized to rotate the ball screw 74 to lower the vertically movable base 76 until the suction member 78 attracts one of the LED chips 16 on the component laying base 64. When the third motor 72 is reversed, the suction member 78 is lifted to remove the LED chip 16 attracted thereby in step S2, as shown in FIG. 5.

Figure 6:
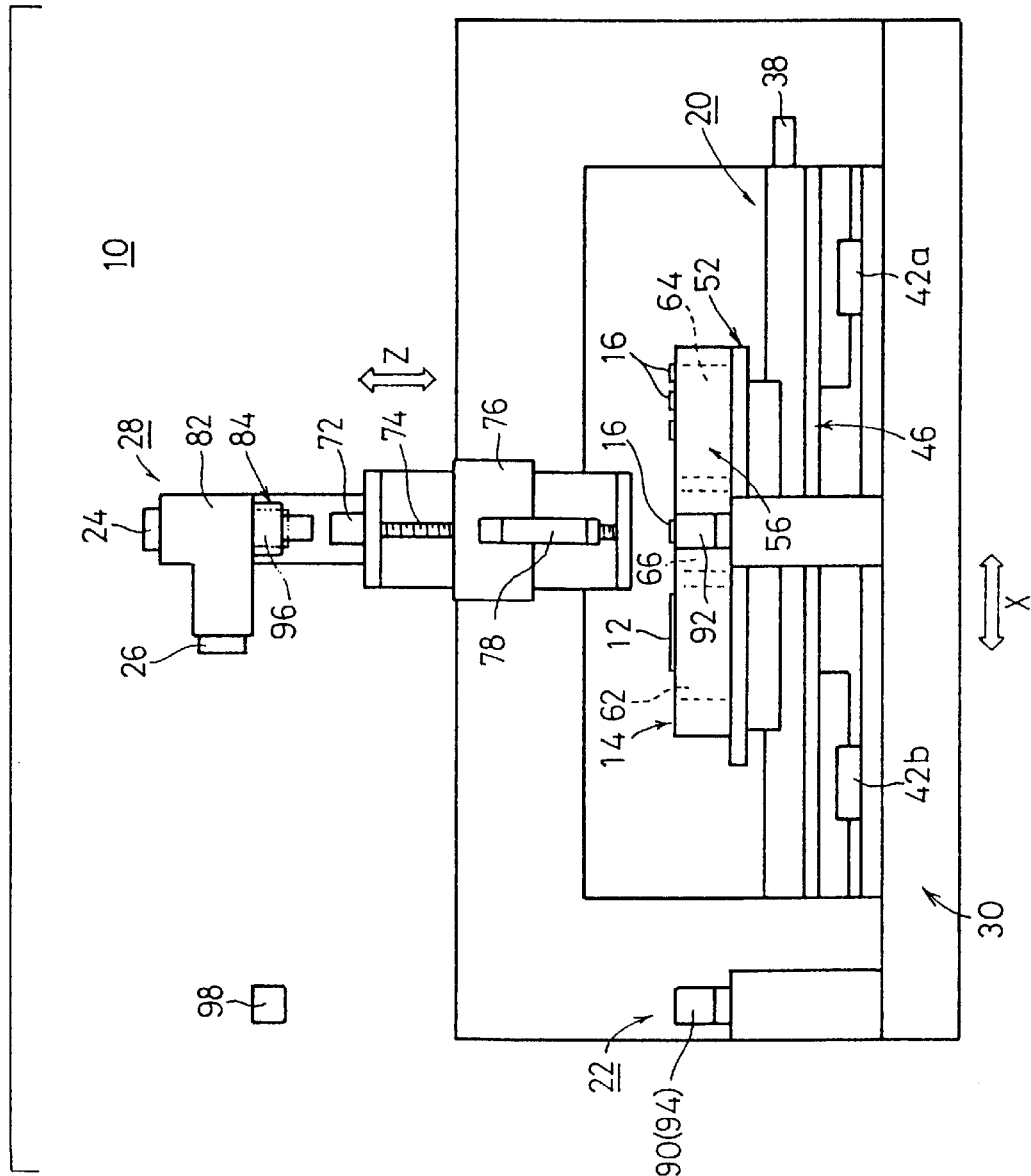
FIG. 6 is a front elevational view of the bonding apparatus shown in FIG. 1 with the LED chip placed on a turntable.

Then, the displacement mechanism 20 is actuated to position the turntable 66 into alignment with the component holding unit 18 in step S3, after which the component holding unit 18 is actuated to lower the suction member 78. The suction member 78 with the LED chip 16 attracted thereby descends, and places the LED chip 16 onto the turntable 66. The suction member 78 then releases the LED chip 16, and thereafter is lifted together with the vertically movable base 76 in step S4, as shown in FIG. 6. The LED chip 16 on the turntable 66 is now imaged by the imaging mechanism 28 in step S5.

Figure 7:
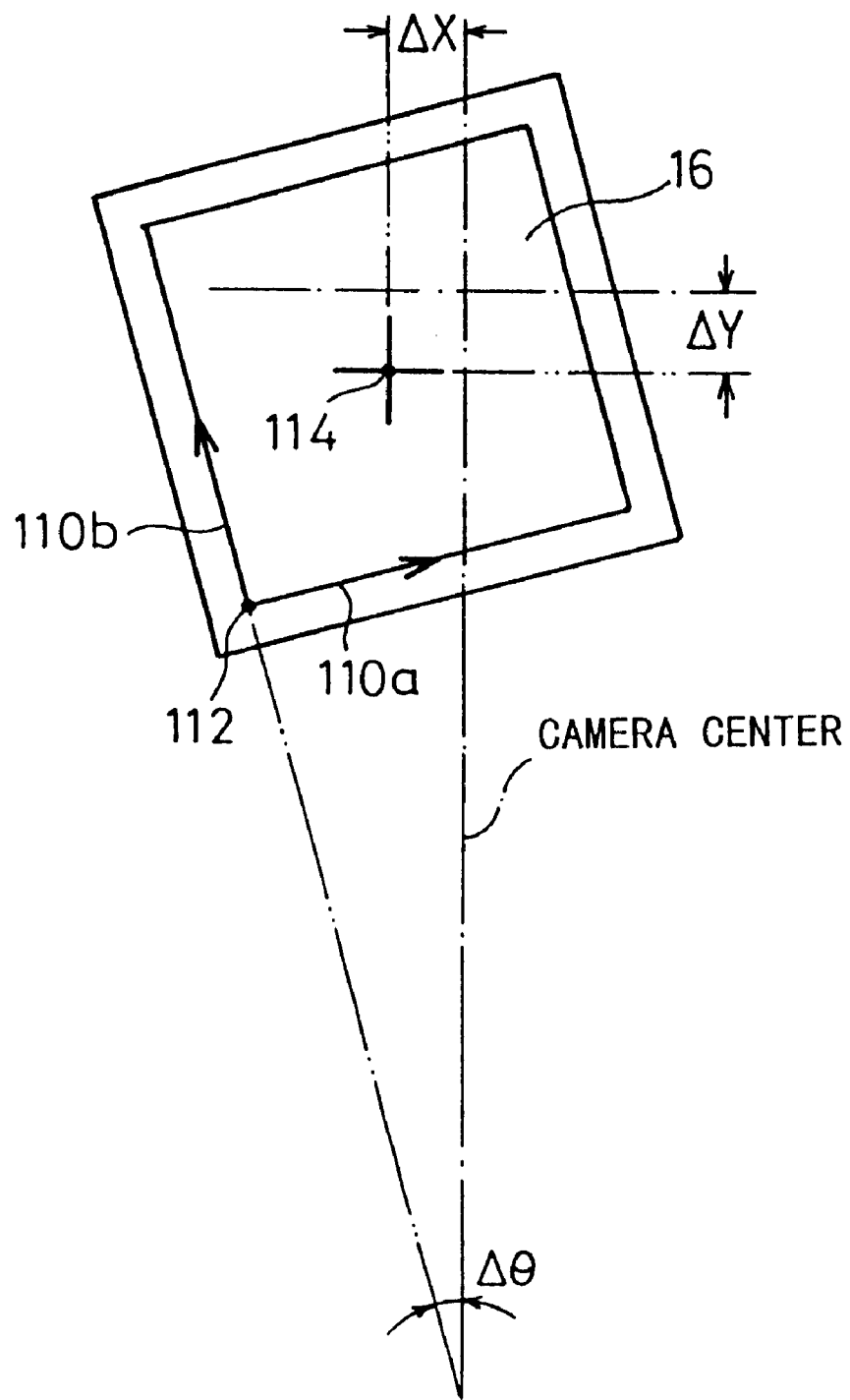
FIG. 7 is a view showing a captured image of the LED chip on the turntable.

Specifically, the LED chip 16 is imaged by the CCD camera 24. When the LED chip 16 is imaged by the CCD camera 24, as shown in FIG. 7, contour reference lines 110a, 10b and a contour reference point 112 of the LED chip 16 are established, and coordinates of a contour center of the LED chip 16 are recognized on the basis of the contour reference lines and the contour reference point 112. A processor (not shown) calculates corrective quantities $\Delta X$, $\Delta Y$, and $\Delta \theta$ for the LED chip 16 with respect to the camera center (the bonding position) based on the contour center 114 of the LED chip 16 in step S6.

The calculated corrective quantities are compared with a predetermined reference value in step S7. If the calculated corrective quantities are greater than the predetermined reference value, then control proceeds to step S8 for moving the LED chip 16 by the corrective quantities. Specifically, the first motor 34 is energized to move the LED chip 16 by the corrective quantity ΔY, the second motor 38 is energized to move the LED chip 16 by the corrective quantity ΔX, and the turntable 66 is rotated to move (rotate) the LED chip 16 by the corrective quantity Δθ. After the LED chip 16 is moved by these corrective quantities, control goes back to step S5.

Figure 8:
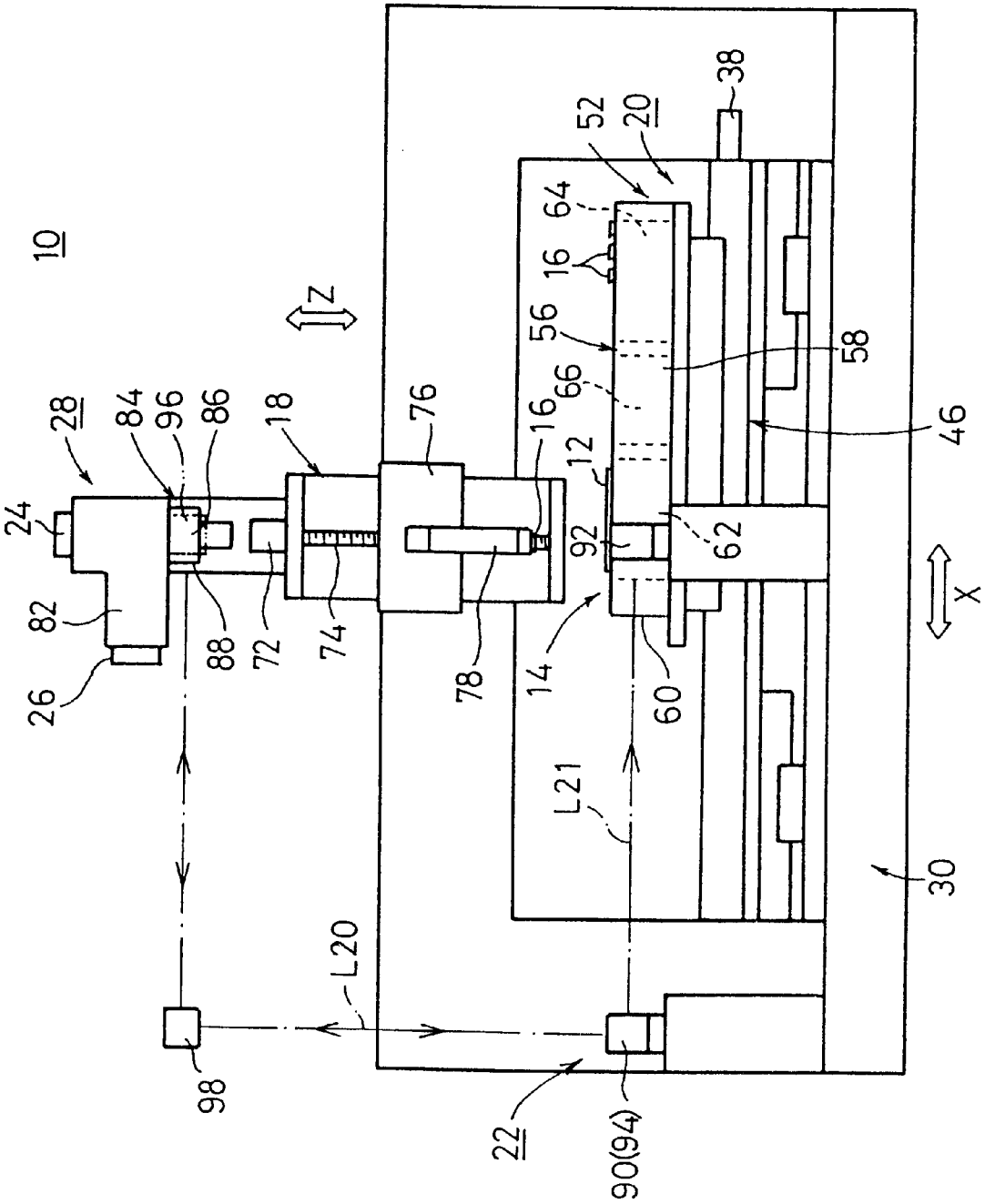
FIG. 8 is a front elevational view of the bonding apparatus shown in FIG. 1 with the LED chip being about to be bonded on a board.

If the calculated corrective quantities are smaller than the predetermined reference value in step S7, then the suction member 78 attracts the LED chip 16 in step S9, and moves upwardly together with the LED chip 16. Then, the displacement mechanism 20 is actuated to bring a bonding position on the board 12 held by the board holding unit 14 into alignment with the imaging mechanism 28 in step S10, as shown in FIG. 8.

The laser distance measuring mechanism 22 then detects whether the bonding position on the board 12 is accurately established or not in step S11. In the laser distance measuring mechanism 22, specifically, the laser beam L emitted from the laser beam source is divided by the beam splitter 90 into the laser beam L1 along the X-axis and the laser beam L2 along the Y-axis, and these laser beams L1, L2 are applied to the respective first and second displaced position detecting means 92, 94. The first and second displaced position detecting means 92, 94 apply the upwardly directed reference beams L10, L20 via the respective mirrors 96, 98 to the first and second reflecting surfaces 86, 88 of the imaging mechanism 28, which reflect the reference beams L10, L20 back to the respective first and second displaced position detecting means 92, 94. Furthermore, the horizontally directed distance measurement beams L11, L21 are applied respectively to the first and second reference surfaces 58, 60 of the mirror block 56, which reflect the distance measurement beams L11, L21 back to the respective first and second displaced position detecting means 92, 94.

The reference beams L10, L20 and the distance measurement beams L11, L21 interfere with each other, producing the interference beams L12, L22 that are emitted from the first and second displaced position detecting means 92, 94 to the first and second receivers 100, 102, respectively. Consequently, the bonding position on the board 12 held in position near the mirror block 56 is biaxially detected.

In the illustrated embodiment, as described above, the laser beams L1, L2 emitted from the beam splitter 90 are divided by the first and second displaced position detecting means 92, 94 into the reference beams L10, L20 and the distance measurement beams L11, L21 that are reflected by the mirror blocks 84, 56. In this manner, relative positions with respect to the reference positions on the X- and Y-axes provided by the fixed CCD cameras 24, 26 are detected for measuring the distance from the bonding position on the board 12 with the laser beams.

Accordingly, the CCD cameras 24, 26 and the bonding position can be positioned accurately relatively to each other, so that the accuracy with which to position the bonding position can effectively be increased. The laser distance measuring mechanism 22 is versatile in applications as the board 12 does not need to be transparent.

After the bonding position is detected by the laser distance measuring mechanism 22, corrective quantities ΔX, ΔY for the bonding position are calculated in step S12. If the calculated corrective quantities ΔX, ΔY are greater than a predetermined reference value in step S13 (NO), then control goes to step S14 in which the bonding position is displaced by the corrective quantities ΔX, ΔY by the displacement mechanism 20. Thereafter control returns to step S11.

If the calculated corrective quantities ΔX, ΔY are smaller than the predetermined reference value in step S13 (YES), then control goes to step S15 in which the suction member 78 with the LED chip 16 held thereby is lowered until the distance between the board 12 and the LED chip 16 becomes several tens of μm. Then, the CCD camera 26, for example, of the imaging mechanism 28 images a reference edge of the LED chip 16 in step S16.

Figure 9:
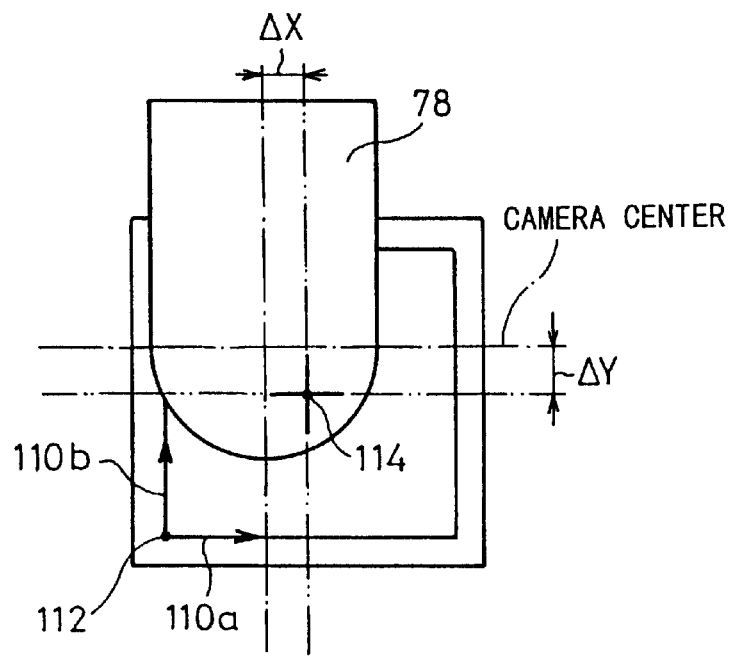
FIG. 9 is a view showing a captured image of the LED chip as positionally corrected which is held by the suction member.
Figure 10:
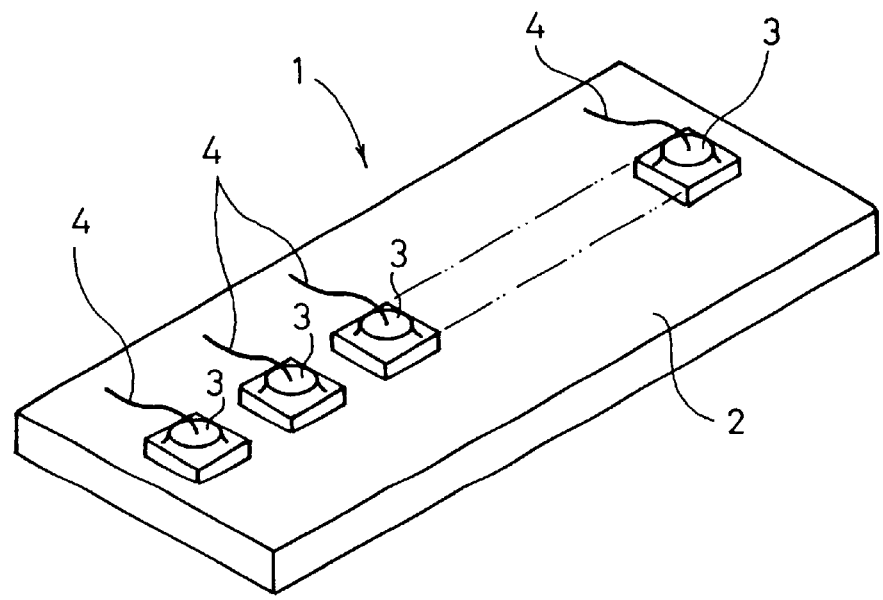
FIG. 10 is a perspective view of an LED array.

As shown in FIG. 9, coordinates of the contour center 114 of the LED chip 16 are detected from the position of the contour reference point 112 of the LED chip 16, and deviations or errors (corrective quantities ΔX, ΔY) between the coordinates of the contour center 114 and the bonding position on the board 12 are calculated in step S17. If the calculated deviations are greater than a predetermined reference value in step S18 (NO), then control goes to step S19 in which the displacement mechanism 20 is actuated to align the bonding position on the board 12 with the coordinates of the contour center 114. Thereafter, control proceeds to step S20 in which the LED chip 16 is bonded on the board 12 by silver paste. If the calculated deviations are smaller than a predetermined reference value in step S18 (YES), then control goes from step S18 to step S20 in which the LED chip 16 is bonded on the board 12 by silver paste.

A next LED chip 16 placed on the component laying base 64 is processed in the same manner as with steps S2 through S9. In step S10, the board suction base 62 is displaced a constant pitch along the X-axis such that the distance between the next LED chip 16 and the previously laid LED chip 16 becomes a given value, after which a new bonding position on the board 12 is determined. Thereafter, the next LED chip 16 is processed in the same manner as with steps S15 through S22, so that it is bonded to the board 12 in the new bonding position.

In this embodiment, bonding positions on the board 12 can be determined highly accurately for allowing a plurality of LED chips 16 to be bonded reliably on the board 12 at equally spaced intervals. Accordingly, it is possible to manufacture a high-quality LED array with ease, and such a high-quality LED array makes it possible to write and read images highly accurately.

In the illustrated embodiment, the board suction base 62 with the board 12 held thereby is displaced along the X- and Y-axes. However, a mirror block may be mounted on the component holding unit 18 with the suction member 78, and the suction member 78 may be displaced along the X- and Y-axes, so that displacements of the component holding unit 18 along the X- and Y-axes may be detected by the laser distance measuring mechanism 22. While the LED chips 16 are aligned with each other at equal spaced intervals on the board 12 in the illustrated embodiment, the principles of the present invention are applicable to all highly accurate two-dimensional bonding processes.

In the bonding method and apparatus according to the present invention, the distance of the board holding means which holds the substrate or the component holding means which holds the component, from the bonding position is directly detected by laser beams for positioning the component highly accurately with respect to the bonding position. Consequently, components can be bonded on the board at highly accurately spaced intervals.

Although a certain preferred embodiment of the present invention has been shown and described in detail, it should be understood that various changes and modifications may be made therein without departing from the scope of the appended claims.

What is claimed is:

1. A method of bonding a component on a board at a predetermined position thereon, comprising the steps of:
   displacing board holding means for holding a board and component holding means for holding a component relatively to each other to reach a bonding position;
   measuring a distance of said board holding means or said component holding means from said bonding position directly with a laser beam; and
   detecting a position of said component with cameras and positionally correcting the component if necessary.

2. A method according to claim 1, wherein said step of measuring the distance of said board holding means or said component holding means from said bonding position comprises the step of detecting a position to which said board holding means is displaced along two axes of an orthogonal coordinate system as a relative position with respect to a reference position along the two axes of said cameras which are fixed.

3. A method according to claim 2, wherein said step of measuring the distance of said board holding means or said component holding means from said bonding position comprises the steps of dividing the laser beam into reference beams and distance measurement beams, reflecting said reference beams with a mirror block associated with said cameras, and reflecting said distance measurement beams with a mirror block associated with said component holding means.

4. An apparatus for bonding a component on a board at a predetermined position thereon, comprising:
   a displacement mechanism for displacing a board holding means for holding a board and a component holding means for holding a component relatively to each other to reach a bonding position;
   a laser distance measuring mechanism for measuring a distance of said board holding means or said component holding means from said bonding position directly with a laser beam; and
   an imaging mechanism for detecting a position of said component with cameras and positionally correcting the component if necessary.

5. An apparatus according to claim 4, wherein said displacement mechanism comprises:
   a first movable stage movable along an axis of an orthogonal coordinate system by a first actuator; and
   a second movable stage movable along another axis of the orthogonal coordinate system with respect to said first movable stage by a second actuator;
   said second movable stage having a mirror block for reflecting the laser beam emitted from said laser distance measuring mechanism.

6. An apparatus according to claim 5, wherein said second movable stage comprises:
   component laying means for laying a plurality of components; and
   a turntable for positionally correcting the component.

7. An apparatus according to claim 5, further comprising:
   a two-focus optical system positioned on the optical axes of said cameras; and
   a mirror block fixed to said two-focus optical system for reflecting the laser beam emitted from said laser distance measuring mechanism to detect a reference position of said cameras.

8. An apparatus according to claim 4, wherein said laser distance measuring mechanism comprises first and second displaced position detecting means for detecting a position to which said board holding means is displaced along two axes of an orthogonal coordinate system, with respect to a reference position along the two axes of said cameras which are fixed.

9. An apparatus according to claim 8, wherein said laser distance measuring mechanism comprises:
   a beam splitter for applying said laser beam to said first and second displaced position detecting means;
   a mirror block for reflecting reference beams divided by said first and second displaced position detecting means to said cameras having said reference position; and
   a mirror block for reflecting distance measurement beams by said first and second displaced position detecting means to said component holding means.

* * * * *